United States Patent
Roux

(10) Patent No.: US 7,087,911 B2
(45) Date of Patent: *Aug. 8, 2006

(54) METHOD FOR RECYCLING GASES USED IN A LITHOGRAPHY TOOL

(75) Inventor: Stephen Roux, New Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/087,639

(22) Filed: Mar. 24, 2005

(65) Prior Publication Data

US 2005/0169767 A1    Aug. 4, 2005

Related U.S. Application Data

(63) Continuation of application No. 10/770,476, filed on Feb. 4, 2004, now Pat. No. 6,894,293, which is a continuation of application No. 10/300,898, filed on Nov. 21, 2002, now Pat. No. 6,770,895.

(51) Int. Cl.
  *H01J 61/12*    (2006.01)
(52) U.S. Cl. .................................. 250/492.2; 250/504
(58) Field of Classification Search ............. 250/492.2, 250/491.1, 493.3, 504, 504 R; 313/570, 313/637–8, 640–42, 231.1, 231.61; 362/263
See application file for complete search history.

(56) References Cited

U.S. PATENT DOCUMENTS

| 4,866,517 A | 9/1989 | Mochizuki et al. |
| 5,991,360 A | 11/1999 | Matsui et al. |
| 6,064,072 A | 5/2000 | Partlo et al. |
| 6,133,577 A | 10/2000 | Gutowski et al. |
| 6,188,076 B1 | 2/2001 | Silfvast et al. |
| 6,341,006 B1 | 1/2002 | Murayama |
| 6,376,329 B1 | 4/2002 | Sogard et al. |
| 6,385,290 B1 | 5/2002 | Kondo et al. |
| 6,493,423 B1 * | 12/2002 | Bisschops .................. 378/119 |
| 6,504,903 B1 | 1/2003 | Kondo et al. |
| 6,507,641 B1 | 1/2003 | Kondo et al. |

(Continued)

FOREIGN PATENT DOCUMENTS

DE    101 34 033 A1    10/2002

(Continued)

OTHER PUBLICATIONS

Copy of Danish Search Report for Singapore Appln. 200306781-6 dated Jun. 21, 2004.

(Continued)

*Primary Examiner*—Nikita Wells
*Assistant Examiner*—James P. Hughes
(74) *Attorney, Agent, or Firm*—Sterne, Kessler, Goldstein & Fox P.L.L.C.

(57) ABSTRACT

A system and method are used to isolate a first gas from a second gas using a third gas. A first chamber includes an element that emits light based on a first gas. A second chamber uses the emitted light to perform a process and includes the second gas. A gaslock that couples the first chamber to the second chamber. A gas source supplies a third gas between the first and the second gas in the gaslock, such that the first gas is isolated from the second gas in the gaslock. The first and third gas can be pumped from the first chamber and separated from one another, such that the first gas can be recycled for reuse to form the emitting light.

7 Claims, 4 Drawing Sheets

U.S. PATENT DOCUMENTS

| | | |
|---|---|---|
| 6,538,257 B1 | 3/2003 | Bisschops |
| 6,559,922 B1 | 5/2003 | Hansell et al. |
| 6,566,667 B1 | 5/2003 | Partlo et al. |
| 6,633,364 B1 | 10/2003 | Hayashi |
| 6,753,941 B1* | 6/2004 | Visser .................. 378/34 |
| 6,762,424 B1 | 7/2004 | Wester |
| 6,770,895 B1 | 8/2004 | Roux |
| 6,894,293 B1* | 5/2005 | Roux .................. 250/492.2 |
| 6,919,573 B1* | 7/2005 | Roux .................. 250/492.2 |
| 2001/0004104 A1 | 6/2001 | Bijkerk et al. |
| 2001/0038442 A1 | 11/2001 | Hansell et al. |
| 2001/0055101 A1 | 12/2001 | Hayashi |
| 2002/0014598 A1 | 2/2002 | Melnychuk et al. |
| 2002/0083409 A1 | 6/2002 | Hamm |
| 2002/0084428 A1 | 7/2002 | Visser et al. |
| 2002/0088940 A1 | 7/2002 | Watahabe et al. |
| 2002/0154279 A1 | 10/2002 | Koster et al. |
| 2003/0038929 A1 | 2/2003 | Tokuda et al. |
| 2004/0108470 A1 | 6/2004 | Ichiki et al. |
| 2004/0155205 A1 | 8/2004 | Roux |
| 2004/0183030 A1 | 9/2004 | Roux |
| 2005/0263720 A1 | 12/2005 | Roux |

FOREIGN PATENT DOCUMENTS

| | | |
|---|---|---|
| DE | 102 38 096 B3 | 2/2004 |
| EP | 0826629 A2 | 3/1998 |
| EP | 0384754 A2 | 8/1999 |
| EP | 1 098 225 A2 | 5/2001 |
| EP | 1 186 958 A2 | 3/2002 |
| EP | 1 248 499 A1 | 10/2002 |
| EP | 0 676 672 B1 | 6/2003 |
| EP | 1 422 568 A2 | 5/2004 |
| EP | 1 460 479 A2 | 9/2004 |
| JP | 10-221499 | 8/1998 |
| JP | 2001-108799 | 4/2001 |
| JP | 2001-511311 | 8/2001 |
| JP | 2003-7611 | 1/2003 |
| WO | WO 99/36950 A1 | 7/1999 |
| WO | WO 99/63790 A1 | 12/1999 |
| WO | WO 02/084406 A1 | 10/2002 |
| WO | WO 2004/051698 A2 | 6/2004 |
| WO | WO 2004/082340 A1 | 9/2004 |
| WO | WO 2004/084592 A2 | 9/2004 |

OTHER PUBLICATIONS

Richardson, M. et al., "Characterization and control of laser plasma flux parameters for soft-x-ray projection lithography," *Applied Optics*, vol. 32, No. 34, pp. 6901-6910 (Dec. 1, 1993).

Stephen Roux, U.S. Patent Appl. No. 11/169,016, filed Jun. 29, 2005, entitled "Method and apparatus for recycling gases used in a lithography tool".

English Abstract for German Patent No. DE10134033, 1 page.

English Abstract for German Patent No. DE10238096, 1 page.

English Abstract for European Patent No. EP1248499, 1 page.

English Abstract for Japanese Patent No. JP10221499, 1 page.

English Abstract for Japanese Patent No. JP2001511311T, 1 page.

English Abstract for Japanese Patent No. JP2001108799, 1 page.

English Abstract for Japanese Patent No. 2003007611, 1 page.

English Abstract for PCT Publication No. WO9936950, 1 page.

English Abstract for PCT Publication No. WO9963790, 1 page.

English Abstract for PCT Publication No. WO2004051698, 1 page.

European Search Report for European Patent Appl. No. 03026062.4 dated Dec. 19, 2005, 3 pages.

Mertens, B.M. et al., "Mitigation of surface contamination from resist outgassing in EUV lithography,"*Microelectronic Engineering*, Elsevier Publishers, vol. 53, No. 1-4, Jun. 2000, pp. 659-662.

* cited by examiner

METHOD FOR RECYCLING GASES USED IN A LITHOGRAPHY TOOL

CROSS REFERENCE TO RELATED APPLICATIONS

This application is a continuation of U.S. Ser. No. 10/770,476, filed Feb. 4, 2004 (now U.S. Pat. No. 6,894,293 that issued May 17, 2005), which is a continuation of U.S. Ser. No. 10/300,898, filed Nov. 21, 2002 (now U.S. Pat. No. 6,770,895 that issued Aug. 3, 2004), which are incorporated by reference herein in their entireties.

This application is related to U.S. Ser. No. 10/392,793, filed Mar. 20, 2003, entitled "Method and Apparatus for Recycling Gases Used in a Lithography Tool," which is incorporated by reference herein in its entirety.

BACKGROUND OF THE INVENTION

1. Field of the Invention

The present invention relates generally to lithography systems. More particularly, the present invention relates to recycling light source gas in a lithography tool.

2. Background Art

Lithography is a process used to create features (e.g., devices) on a surface of one or more substrates (e.g., semiconductor wafers, or the like). Substrates can include those used in the manufacture of flat panel displays, circuit boards, various integrated circuits, and the like. During lithography, the substrate is positioned on a substrate stage and is exposed to an image projected onto the surface of the substrate. The image is formed by an exposure system. The exposure system includes a light source, optics, and a reticle (e.g., a mask) having a pattern used to form the image. The reticle is generally located between the light source and the substrate. In extreme ultraviolet (EUV) or electron beam systems, the light source is housed in a light source vacuum chamber and the exposure system and substrate are housed in an optics vacuum chamber. The light source chamber and the optical chamber can be coupled via a gaslock.

In a lithography, feature (e.g., device) size is based on a wavelength of the light source. To produce integrated circuits with a relatively high density of devices, which allows for higher operating speeds, it is desirable to image relatively small features. To produce these small features, a light source is needed that emits short wavelengths of light (e.g., around 13 nm). This radiation is called EUV light, which is produced by plasma sources, discharge sources, synchrotron radiation from electron storage rings, or the like.

In some systems, EUV light is created by utilizing a discharge plasma light source. This type of light source uses a gas or target material which is ionized to create the plasma. For example, the plasma-based light source can use a gas such as xenon. Then, the plasma is formed by an electrical discharge. Typically, the EUV radiation can be in the range of 13–14 nm. In other systems, EUV radiation is produced from laser produced plasma sources. In the laser produced plasma source, a jet of material (e.g., xenon, clustered xenon, water droplets, ice particles, lithium, tin vapor, etc.) can be ejected from a nozzle. A laser is spaced from the nozzle and emits a pulse that irradiates the jet to create the plasma. This plasma subsequently emits EUV radiation.

In order to produce a relatively large amount EUV light, a concentration of xenon must be relatively high where the plasma is being created (e.g., in the light source chamber). This produces a pressure that is too high for efficient transmission of the EUV light through the remainder of the system (e.g., the optics chamber). As a result, the path in which the EUV light travels must be evacuated. Usually, large vacuum pumps are used to remove the source gas as quickly as possible after it has performed its function of creating the EUV light. Unfortunately, at high machine throughput, a relatively large amount of source gas is pumped away. The cost of source gas such as xenon is substantial, and will result in a higher per wafer cost unless the source gas is recycled. Recycling the source gas is complicated by the inclusion of other gases being emitted from the remainder of the EUV lithography tool that mix with the source gas.

Accordingly, in some lithography tools the source gas is kept separate from gases in the remainder of the lithography tool by a very thin membrane. The membrane also removes unwanted radiation by functioning as a spectral filter. However, lithography tools having high throughput and high light intensity may not be able to have the membrane due to high thermal loading, which destroys the membrane. Thermal calculations show that the membrane would have to have a very large surface area to avoid vaporizing when the light source is turned on. A large surface, extremely thin membrane cannot be used in practice, even if they could be manufactured, due to their fragile nature. If the membrane is removed, a barrier between the source chamber and the rest of the tool is gone and gas mixing occurs, making the source gas recycling task extremely challenging, and in some cases completely impractical.

Therefore, what is needed is a method and apparatus of isolating gas in a light source chamber from gases being emitted from the remainder of a lithography tool to allow the gas in the source chamber to be efficiently recycled.

BRIEF SUMMARY OF THE INVENTION

An embodiment of the present invention provides a system including a first chamber including an element that emits light based on a first gas and a second chamber that uses the emitted light to perform a process and that includes a second gas. The system also includes a gaslock that couples the first chamber to the second chamber. The system further includes a gas source that supplies a third gas between the first and the second gas in the gaslock, such that the first gas is isolated from the second gas by the gaslock.

Another embodiment of the present invention provides a system, including a light source chamber having a first gas, an optics chamber having a second gas, a first means for coupling the light source chamber to the optics chamber, and a second means for passing a third gas through the first means to isolate the first gas from the second gas.

A further embodiment of the present invention provides a method including (a) producing light with a first gas, (b) processing optics with a second gas, and (c) separating the first gas from the second gas with a third gas that flows between them.

In one aspect of the embodiment, the first and third gas are pumped from the first chamber, the first gas is separated from the third gas, such that the first gas can be recycled for reuse.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

Figure 1:
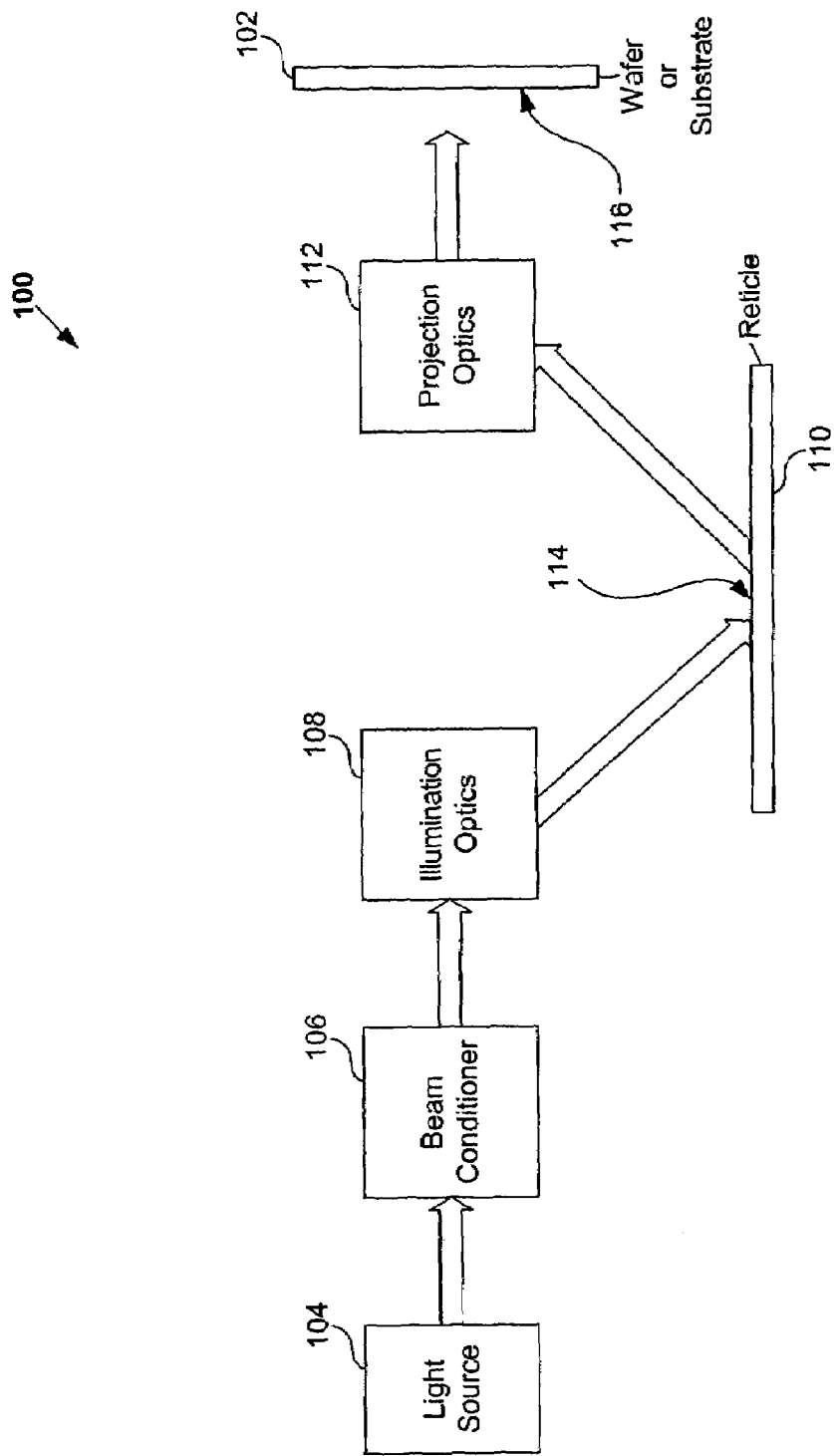
FIG. 1 shows a lithographic system, according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 show a system 100 for forming a pattern on a wafer or substrate 102 according to embodiments of the present invention. A light source 104 (e.g., an EUV light source) emits a light beam that passes through a beam conditioner 106 and illumination optics 108 before being reflected from a reticle or mask 110. After reflecting from reticle or mask 110, the light beam passes through projection optics 112, which is used to transfer a pattern from a surface 114 of reticle or mask 110 onto a surface 116 of wafer or substrate 102. Other arrangements of these elements can be used without departing from the spirit and scope of the present invention.

Figure 2:
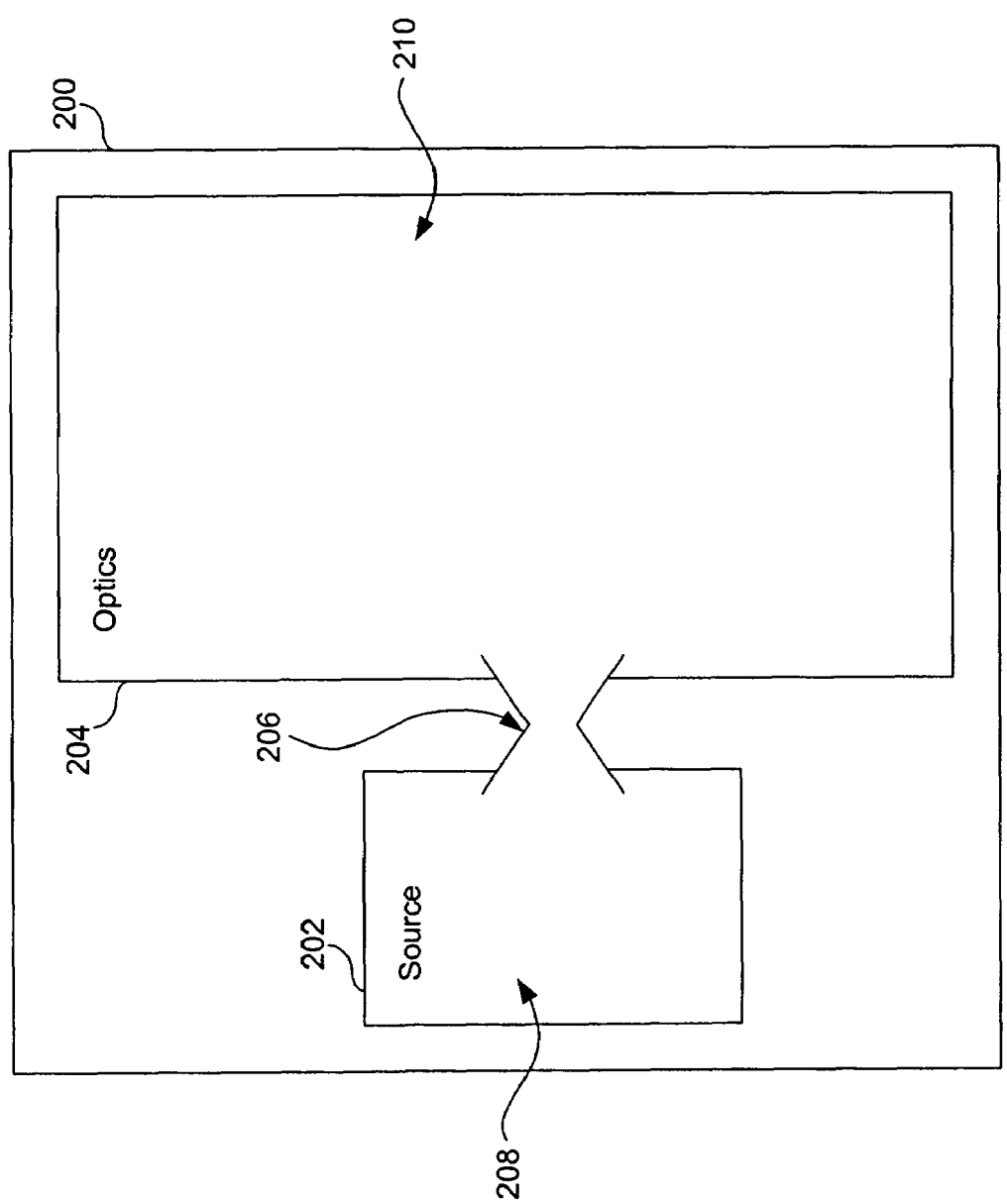
FIG. 2 shows a lithographic system, according to embodiments of the present invention.

FIG. 2 shows details of an exemplary system 200 according to an embodiment of the present invention. System 200 includes a first chamber (e.g., a light source chamber or vacuum light source chamber) 202 and second chamber (e.g., an optics chamber or optics vacuum chamber) 204. Second chamber 204 can include one or more of: a beam conditioner, illumination optics, a reticle, projection optics, and/or a wafer. First chamber 202 and second chamber 204 can be coupled via a gaslock 206. Basically, a gaslock is an area that allows first and second gases to remain isolated from one another based on a third gas flowing between them (e.g., forming a barrier between them), which suppresses: mixing of the first and second gas or transfer of material from first chamber 202 to second chamber 204, or vice versa.

When a plasma-based light source is housed in first chamber 202, a first gas or other material 208 (e.g., xenon, lithium vapor, tin, krypton, water vapor, a metal target, or the like) is ionized to create the plasma, as discussed above. First gas 208 is only supplied to first chamber 202 during a time when light is being generated. At other times (e.g., during stand-by, idle, maintenance, or other modes), first chamber 202 is substantially in a vacuum state. Second chamber 204 includes a second gas (e.g., a process gases, such as helium, argon, hydrogen, nitrogen, or the like) 210. Second gas 210 can be used to reduce contamination in second chamber 204 and protect lithography tool mirrors located in second chamber 204. Similarly to first gas 208, second gas 210 is only supplied to second chamber 204 during a time when cleaning or protection is required. At other times, second chamber 204 is substantially in a vacuum state. A vacuum state is needed in chambers 202 and 204 to allow EUV light to be transmitted because EUV light has a substantially short wavelength (e.g., 13–14 nm), so it cannot readily pass through any gas, which usually absorbs it. Thus, a vacuum state allows this wavelength of light to easily travel to and through second chamber 204.

Figure 3:
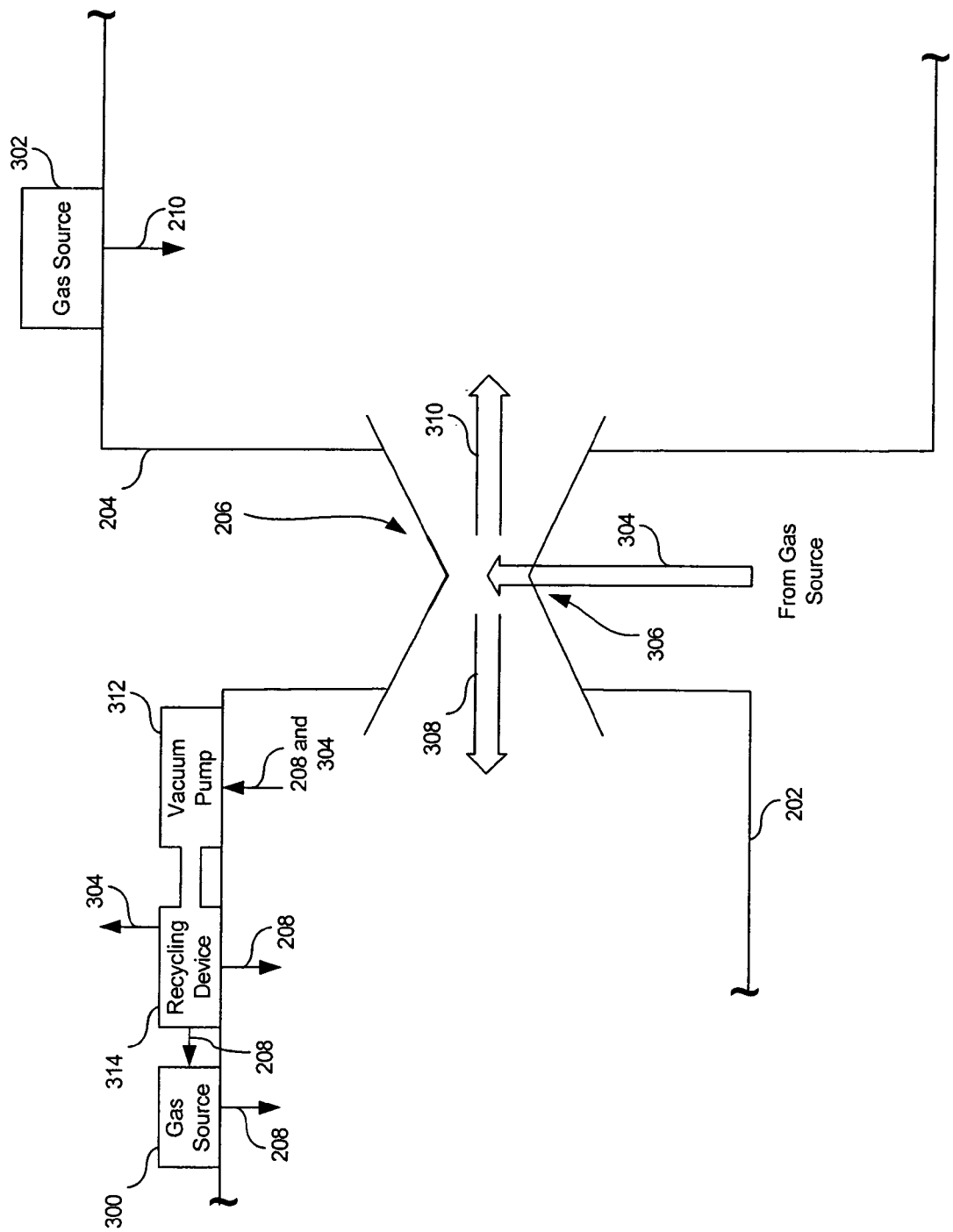
FIG. 3 shows gas flow through a gaslock in the lithographic system of FIG. 2.

FIG. 3 illustrates an interaction of gases in gas lock 206 according to embodiments of the present invention. First and second gases 208 and 210 are supplied to first and second chambers 202 and 204 via first and second gas sources 300 and 302. A third gas 304 (e.g., helium, neon, nitrogen, etc.) is passed through an inlet 306 in gas lock 206 from a gas source (not shown). In an embodiment, third gas 304 can be continuously passed through an inlet in gas lock 206. Third gas 304 should be chosen so that it is easily stripped out of first gas 208 during a recycling device stage (e.g., a purifying and recycling stage), as discussed below. By purifying and recycling first gas 208, system 200 of the present invention reduces costs over conventional systems that must discard the first gas 208 after its initial use because it mixes with second gas 210. The discarding of first gas 208 makes up substantial amount of the running expense of the tool.

The flow of third gas 304 forces molecules of first gas 208 to travel in a direction of arrow 308. Similarly, the flow of third gas 304 forces molecules of second gas 210 to travel in a direction of arrow 310. Thus, the flow of third gas 304 isolates first gas 208 from the second gas 210. In an embodiment, first gas 208 and third gas 304 are pumped from first chamber 202 using a pump (e.g., a vacuum pump) 312. Then, first gas 208 is separated from third gas 304 in recycling device 314, such that first gas 208 can be reused to form the emitted light. For example, third gas 304 can be chosen to have a freezing point (e.g., −60° C.), which is substantially above a freezing point (e.g., −200° C.) of first gas 208. Then, third gas 304 is frozen, separated from first gas 208, and removed from recycling device 314. In various embodiments, first gas 208 can either be reused directly from recycling device 314 or transmitted to gas source 300.

It is to be appreciated that in various embodiments third gas 304 can be reused after exiting recycling device 314 or it can be discarded. It is also to be appreciated that although pump 312 and recycling device 314 are shown coupled directly to a top of first chamber 202, either one or both of pump 312 and recycling device 314 can be indirectly coupled to first chamber 202 and/or they can be positioned anywhere with respect to first chamber 202. Also, although not shown, it is to be appreciated that second gas 210 can also be recycled using similar or functionally similar devices, as is known in the art.

Figure 4:
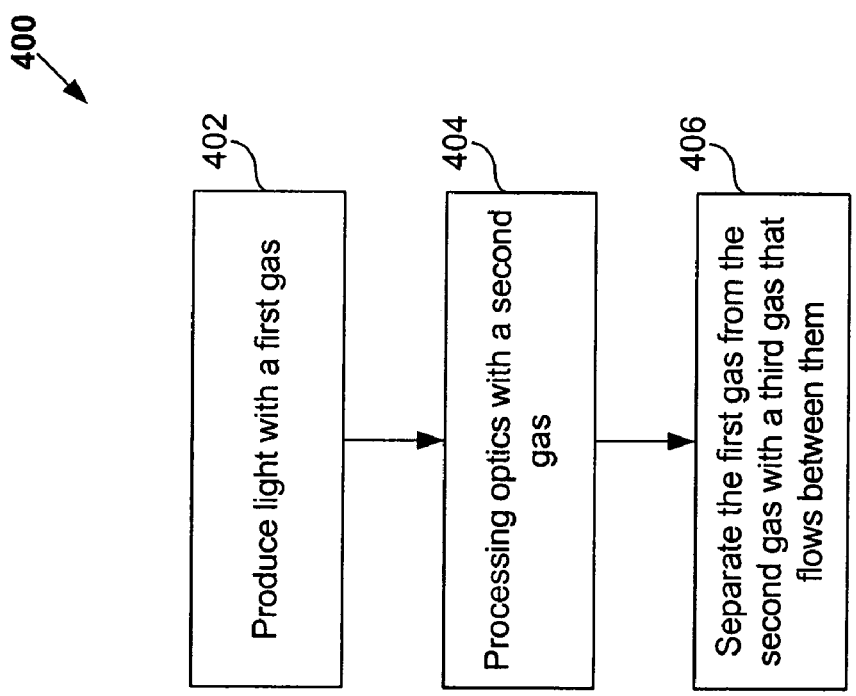
FIG. 4 shows a flowchart depicting a method according to an embodiment of the present invention.

FIG. 4 shows a flowchart depicting a method 400 according to an embodiment of the present invention. At step 402, light (e.g., extreme ultraviolet light) is produced with a first gas (e.g., xenon, lithium vapor, tin, krypton, and water vapor). At step 404, optics are processed with a second gas (e.g., helium, argon, hydrogen, and nitrogen). At step 404, the first gas is separated (e.g., isolated) from the second gas with a third gas (e.g., helium, neon, and nitrogen. that flows between them.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method, comprising:
   (a) receiving in a gas lock a first gas from a first portion of a lithography tool;
   (b) receiving in the gas lock a second gas from a second portion of the lithography tool;
   (c) directing a third gas between the received first gas and the received second gas to isolate the first gas from the second gas in the gas lock;
   (d) removing the first and third gas from the gas lock;
   (e) separating the first from the third gas; and
   (f) recycling the first gas.

2. The method of claim 1, wherein step (a) comprises:
   using one of xenon, lithium vapor, tin, krypton, and water vapor as the first gas.

3. The method of claim 1, wherein step (b) comprises:
   using one of helium, argon, hydrogen, and nitrogen as the second gas.

4. The method of claim 1, wherein step (c) comprises:
   using one of helium, neon, and nitrogen as the third gas.

5. The method of claim 1, wherein:
   the first gas is received at the gas lock from a light source chamber; and
   the second gas is received at the gas lock from an optics chamber.

6. The method of claim 5, further comprising:
   using the first gas to generate a plasma illumination in the light source chamber.

7. The method of claim 6, wherein the plasma illumination is produced having wavelengths in an extreme ultra violet spectrum.

* * * * *